United States Patent [19]

Endo et al.

[11] Patent Number: 4,758,864
[45] Date of Patent: Jul. 19, 1988

[54] PROJECTION EXPOSURE APPARATUS

[75] Inventors: Kazumasa Endo; Yasuhisa Matsumoto, both of Kawasaki, Japan

[73] Assignee: Nippon Kogaku K.K., Tokyo, Japan

[21] Appl. No.: 88,143

[22] Filed: Aug. 21, 1987

[30] Foreign Application Priority Data

Aug. 28, 1986 [JP] Japan .................................. 61-202275

[51] Int. Cl.⁴ ...................... G03B 27/52; G03B 27/70
[52] U.S. Cl. ....................................... 355/43; 355/53; 356/401
[58] Field of Search ........................ 355/53, 54, 55, 57, 355/43; 357/52; 358/400, 401

[56] References Cited

U.S. PATENT DOCUMENTS

| | | | |
|---|---|---|---|
| 4,492,459 | 1/1985 | Omata | 355/43 |
| 4,508,749 | 4/1985 | Brannon et al. | 357/52 X |
| 4,620,785 | 11/1986 | Suzuki et al. | 355/53 |
| 4,629,313 | 12/1986 | Tanimoto | 355/53 |
| 4,655,601 | 4/1987 | Suzuki | 355/53 X |
| 4,657,379 | 4/1987 | Suwa | 355/53 |
| 4,669,867 | 6/1987 | Uda et al. | 355/53 |
| 4,690,529 | 9/1987 | Sugiyama et al. | 355/43 X |
| 4,711,567 | 12/1987 | Tanimoto | 355/53 |

Primary Examiner—Richard A. Wintercorn
Attorney, Agent, or Firm—Shapiro and Shapiro

[57] ABSTRACT

A projection exposure apparatus on which are placed a reticle whose pattern is comprised of an area transmitting a radiation therethrough and an area not transmitting the radiation therethrough and a substrate includes a projection optical system for projecting the pattern formed on the reticle onto the substrate, the projection optical system being telecentric on the substrate side, a device producing a radiation beam for alignment of the reticle and the substrate, an alignment device for supplying the radiation beam onto the substrate through the reticle and the projection optical system and detecting the relative positional relation between the reticle and the substrate through the projection optical system, a device for imparting displacement to the projection optical system to the position of incidence of the radiation beam onto the projection optical system by the alignment device, a device for outputting a position signal conforming to the relative position of the optic axis of the projection optical system and the position of incidence, and a deflecting device responsive to the position signal to deflect the angle of the principal ray of the radiation beam entering the projection optical system so that the telecentricity of the projection optical system on the substrate side is maintained.

12 Claims, 9 Drawing Sheets

PROJECTION EXPOSURE APPARATUS

BACKGROUND OF THE INVENTION

1. Field of the Invention

This invention relates to an apparatus for projecting a reticle (a mask) having a predetermined pattern onto the surface of a wafer to which photoresist is applied, by a projection lens, to thereby print the predetermined pattern on the surface of the wafer, and in particular to improvements in a so-called alignment device for effecting alignment of the reticle and the wafer in such an apparatus.

2. Related Background Art

It is usual to use, as a projection lens for projecting and exposing a pattern on a reticle onto a wafer, a lens which is telecentric on the wafer side so that no error of projection magnification occurs even for some focus deviation on the wafer surface. In such a projection exposure apparatus, one of relative alignment systems for the reticle and the wafer is a so-called TTL (through the lens) alignment system for aligning the reticle and the wafer through a projection objective lens.

In such TTL alignment system also, it is desirable that alignment light be telecentric on the wafer side with respect to the projection objective lens. This is for preventing any focus error on the wafer side from affecting the alignment accuracy during alignment. That is, the reason is that even if there is any focus error, the alignment light causes no positional deviation thereof on the wafer.

Generally, projection objective lenses are telecentric on the wafer side, but there are some projection objective lenses which are telecentric on the reticle side as well or which are non-telecentric on one of the wafer side and the reticle side. (These will hereinafter be referred to as the both-side telecentric projection objective lens and the one-side telecentric projection objective lens.)

In the one-side telecentric projection objective lens, it is necessary to incline the principal ray by a desired angle with respect to the optic axis in the other portions than the optic axis in order to maintain telecentricity on the wafer side, and this angle differs depending on the position on the reticle. Accordingly, where the relative position of the reticle and the wafer is detected through the one-side telecentric projection objective lens, the reticle side principal ray has an inclination with respect to the reticle surface at the other points than the optic axis, and this inclination differs specifically depending on the distance from the optic axis and therefore, it is liable to be affected by the focus error on the wafer side. That is, when the principal ray of the alignment light does not form a desired angle with respect to the reticle, the principal ray of the alignment light is inclined with respect to the optic axis of the projection lens on the wafer side, and the position of the mark of the wafer aligned with the mark of the reticle changes in conformity with the presence or absence of the focus error. Also, the images position of an optical signal from the wafer moves on the light-receiving surface of optical signal detecting means, and this has led to the tendency that alignment becomes difficult to accomplish.

Figure 1:
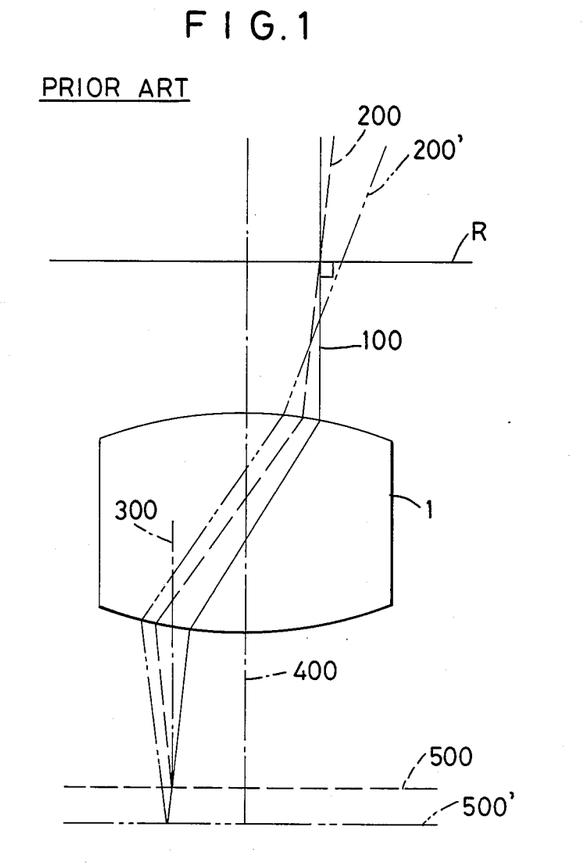
FIG. 1 is a schematic view illustrating the principle of the present invention.

Now, even in the both-side telecentric projection objective lens, it is difficult due to the aberration of the pupil of the lens to keep perfect telecentricity. Accordingly, even if as shown in FIG. 1 of the accompanying drawings, a light ray 100 is parallel to the optic axis 400 of the both-side telecentric projection lens 1 on the reticle R side of the projection lens, the light ray 100 will be inclined with respect to the optic axis 400 of the projection lens on the wafer side of the projection lens under the influence of the aberration. Dots-and-dash line 300 is a line parallel to the optic axis 400 of the projection lens 1. When the wafer is positioned on a surface 500 conjugate with the reticle R with respect to the projection lens, the light ray 200 reflected by the wafer enters the same position as the light ray 100 relative to the reticle R, while the light ray 200 follows an optical path different from the light ray 100 and thus, there arises a problem similar to that peculiar to the aforedescribed one-side telecentric projection objective lens. The angle formed by and between the light ray 100 on the wafer side and the line 300 is varied by the amount of relative derivation between the light ray 100 and the optic axis 400. Further, when the wafer is positioned on a surface 500' which is not conjugate with the reticle R with respect to the projection lens 1 due to any focus error, the light ray 200 reflected by the wafer enters a position different from the light ray 100 relative to the reticle R and therefore, it is affected by the focus error as in the aforedescribed one-side telecentric projection objective lens.

SUMMARY OF THE INVENTION

It is the object of the present invention to provide an apparatus for accurately aligning a reticle and a substrate such as a wafer through a projection objective lens in any of the case where the projection objective lens is a one-side telecentric projection objective lens and the case where the projection objective lens is a both-side telecentric projection objective lens.

The present invention is basically a projection exposure apparatus having a projection optical system for projecting a pattern on a reticle onto a wafer, the projection optical system being telecentric on the reticle side, and an alignment optical system for supplying an illuminating light onto the wafer through said reticle and said projection optical system and detecting the positional relation between said reticle and said wafer through said projection optical system. By providing moving means for varying the observation position on the reticle surface by the alignment optical system, the present invention is constructed such that alignment is possible even if the position of the alignment mark on the reticle is varied. In such a construction, there are provided means for making a signal indicative of the relative position of said observation position by said projection optical system and the optic axis of said alignment optical system, and deflecting means responsive to said signal to deflect the angle of the principal ray of the illuminating light beam supplied from said alignment optical system.

According to the construction as described above, even when the optic axis of said projection optical system and the observation position by said alignment optical system are varied, the principal ray of the illuminating light beam is supplied so as to be always perpendicular on the wafer side, that is, parallel to the optic axis, by the deflecting means, and therefore, the telecentricity of the projection objective lens on the wafer side is strictly maintained to enable accurate alignment to be accomplished. Accordingly, even when alignment of the wafer and the reticle is to be effected by means of alignment marks different in position on the reticle, accurate alignment becomes possible.

DESCRIPTION OF THE PREFERRED EMBODIMENT

Figure 2:
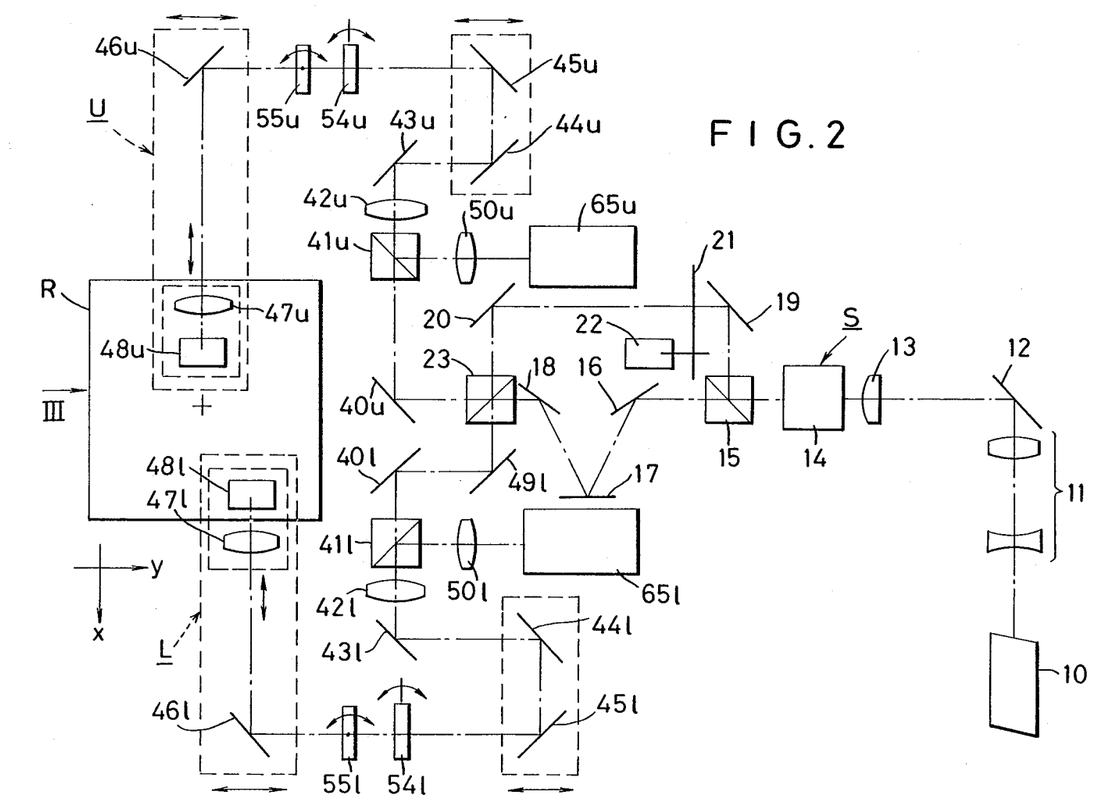
FIG. 2 is a plan view schematically showing the construction of an alignment optical system according to the present invention.
Figure 3:
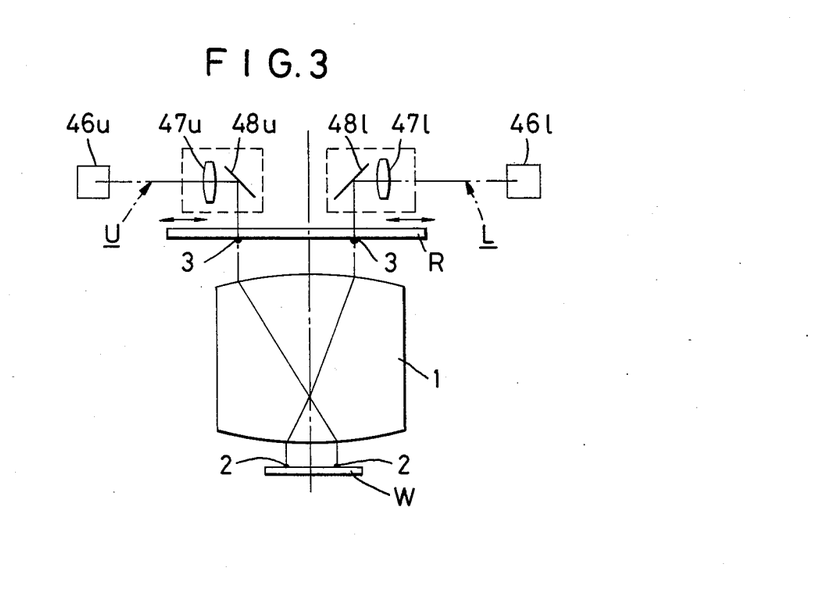
FIG. 3 is a cross-sectional view along the arrow II of FIG. 2 and along the optic axis of a projection objective lens.

The alignment optical apparatus according to the present invention shown in FIG. 2 adopts the so-called TTL alignment system as shown in FIG. 3 wherein a reticle R and a wafer W are aligned through a both-side telecentric projection objective lens 1.

As shown in FIG. 3, the reticle R and the wafer W are disposed at positions conjugate with respect to the reduction projection objective lens 1.

Figures 4, 5:
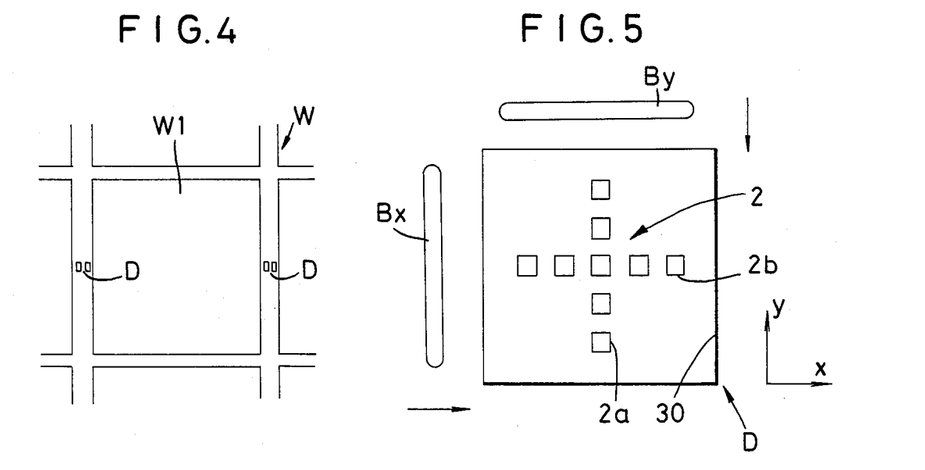
FIG. 4 is an enlarged plan view showing an exposed area of a wafer.
FIG. 5 is a plan view showing the positional relation between an alignment area and a scanning beam for alignment.

Referring now to FIG. 4 which shows an exposed area W1 of the wafer 1 on an enlarged scale, square alignment areas D and D are provided at the left and right end portions of the exposed area W1. The alignment area D is shown in FIG. 5 on an enlarged scale. In each alignment area D, there is provided, as an alignment mark on the wafer W, a cross mark 2 comprising square minute pattern rows 2a and 2b.

On the other hand, on the reticle R, as shown in FIG. 3, rectangular transmitting portions (rectangular marks) 3 and 3 are provided as alignment marks. Each rectangular transmitting portion 3 is formed by the edge of a light-intercepting portion made of a chromium surface, and the image 30 of the edge of the light-intercepting portion is formed on the cross mark 2 by the reduction projection lens 1 as shown in FIG. 5.

FIG. 5 shows the positional relation between the image 30 of the edge of the light-intercepting portion and the cross mark 2 in a completed alignment state in which by the reticle R or the wafer W being moved, the vertical marks 2a and horizontal marks 2b of the cross mark 2 are positioned at the center of the image 30 of the edge of the light-intercepting portion.

The alignment optical apparatus shown in FIG. 2 comprises pairs of plane parallel plates 54u, 55u and 54l, 55l for deflecting a light beam by a minute amount in the alignment optical system, added to what is disclosed in a prior application (Japanese patent application No. 79399/1986) filed by the applicant.

The alignment optical apparatus shown in FIG. 2 is provided with a vertical-horizontal scanning system S for alternately scanning the image 30 of the edge of the light-intercepting portion and the cross mark 2 superposed one upon the other by the reduction projection lens 1 as shown in FIG. 5, by a band-like vertical scanning beam By and a band-like horizontal scanning beam Bx, and two sets of microscope systems U and L disposed above the reticle R.

A light beam emitted from a laser 10 passes through a beam expander 11, is reflected by a mirror 12, and passes through a cylindrical lens 13 for forming an elliptical beam and through a scanner 14 into a half-prism 15. The scanner 14 is for scanning the elliptical beam formed by the cylindrical lens 13 on an object surface, and may be one of various structures such as a rotational polygon mirror, a galvano mirror, a transmitting type rotational prism and a reflecting type vibratory prism.

In the transmission optical path of the half-prism 15, there is disposed an image rotating member comprising three reflecting surfaces, and the direction of the transmitted light beam is turned by 90° by these reflecting surfaces. Reflecting mirrors 19 and 20 are disposed in the reflection optical path of the half-prism 15, and a rotatable shutter blade for alternately passing the light transmitted through the half-prism 15 and the light reflected by the half-prism 15 is rotated by a motor 22. Therefore, the light reflected by the half-prism 15 and the light transmitted through the half-prism 15 alternately enter a half-prism 23, and elliptical beams in directions orthogonal to each other are alternately supplied. The light transmitted through the half-prism 23 is reflected by a mirror 40u and supplied to the microscope system U in the upper portion of FIG. 2, and the light reflected by the half-prism 23 is reflected by a mirror 40l and supplied to the microscope system L in the lower portion of FIG. 2. The microscope systems U and L are designed to alternately scan the vertical scanning beam and the horizontal scanning beam from the half-prism 23 on the surface of the reticle R and are substantially equivalent optical systems, and therefore, only the microscope system U will hereinafter be described. In FIG. 2, the functionally similar members of the microscope systems U and L are given similar reference numerals with suffixes u and l affixed thereto for distinction between the two systems.

The microscope system U is comprised of a light-transmitter system for causing the vertical scanning beam and the horizontal scanning beam alternately supplied from the half-prism 23 to perpendicularly enter from above the reticle R, and a light-receiving system for receiving the reflected light beams from the edge 30 of the light-intercepting portion and the cross mark 2 scanned by the vertical scanning beam and the horizontal scanning beam. In the light-transmitter system, the vertical and horizontal scanning beams alternately supplied from the half-prism 23 are reflected toward a half-prism 41u by a mirror 40u, pass through a second objective lens 42u and a mirror 43u, are reflected by mirrors 44u and 45u forming an orthogonal reflecting mirror movable along the optic axis to correct the length of the optical path, are reflected by a mirror 46u, pass through a first objective lens 47u are reflected by a mirror 48u and reach the surface of the reticle R. The objective lens 47u and the mirror 48u are movable as a unit in the direction of the optic axis (the x-direction), and these and the mirror 46u are further movable as a unit in the orthogonal direction (the y-direction), and these two movements are effected independently of each other, whereby the observation position in which alignment is effected can be changed on the surface of the reticle as desired. In order to maintain the image position and the pupil position in a predetermined conjugate relation even for these movements, the mirrors 44u and 45u as the orthogonal reflecting mirror are moved as a unit along the optic axis to thereby keep the length of the optical path constant.

In such a construction, a pair of plane parallel plates 54u and 55u are disposed in the parallel light beam between the mirror 45u and the mirror 46u such that their inclinations vary in planes orthogonal to each other relative to the optic axis. By changing the angles of inclination of these plane parallel plates, the angle of the principal ray of the illuminating light beam emerging from the objective lens 47u can be varied, and can be corrected so that on that side of the projection objective lens 1 which is adjacent to the wafer, the emergent principal ray is always perpendicular to the wafer, that is, it emerges in parallelism to the optic axis.

Description will hereinafter be made in detail of a construction for achieving the maintenance of the telecentricity on the wafer side by such a variation in the angles of the plane parallel plates.

Figure 6:
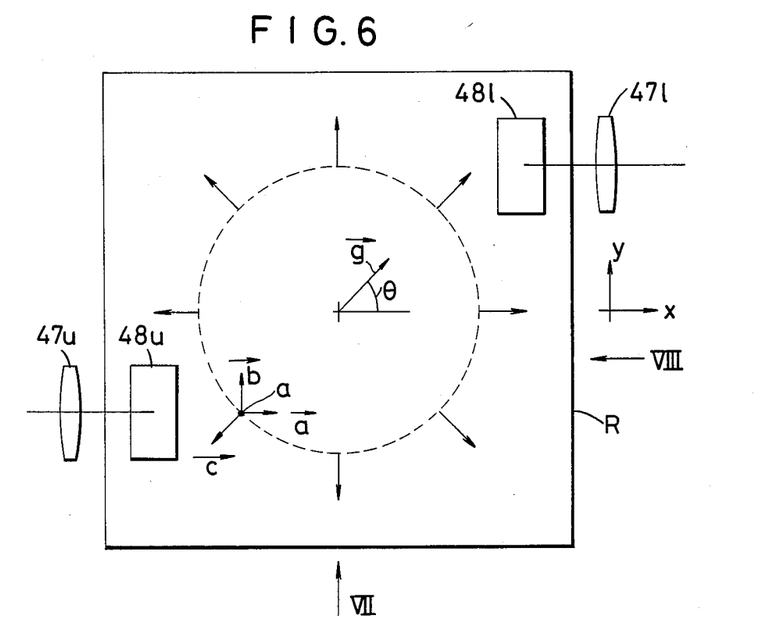
FIG. 6 is a plan view showing the state of the off-axial principal ray on the reticle side of the projection objective lens.

FIG. 6 shows the state of the off-axial principal ray on that side of the projection objective lens 1 which is adjacent to the reticle. Radial arrows indicated on the reticle R are such that the inclination of the principal ray of the reduction projection objective lens 1 on the reticle R side is dealt with as a vector and the principal ray is regularly projected onto the xy plane on the reticle R. The inclination of this principal ray is rotation-symmetrical relative to the optic axis of the projection objective lens 1.

Figure 7:
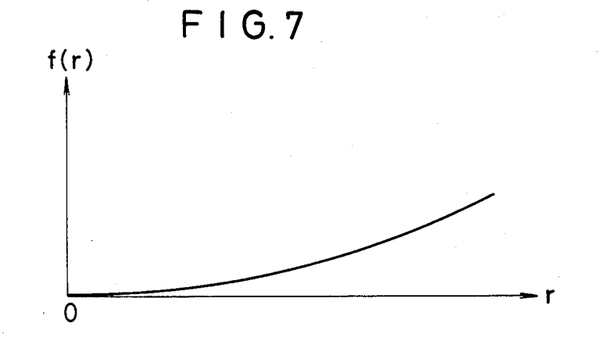
FIG. 7 is a graph showing the amount of deviation f(r) of telecentricity relative to the distance r on the reticle R from the optic axis of the projection objective lens.

Referring to FIG. 7, the horizontal axis represents the distance r on the reticle R from the optic axis of the projection objective lens, and the vertical axis represents the amount of inclination of the principal ray on the reticle R side, i.e., the amount of deviation f(r) of the telecentricity.

As shown in FIGS. 6 and 7, where the projection objective lens 1 constructed telecentrically on both sides has an aberration of the pupil thereof, if on the reticle R side, the principal ray of the alignment light is parallel to the optic axis, telecentricity will be lost on the wafer W and an alignment error will be caused. So, in the present invention, the inclination of the principal ray of the alignment light is varied on the reticle side in conformity with the alignment mark position to thereby ensure perfect telecentricity to be maintained on the wafer W and prevent the alignment accuracy from being affected by the aberration of the pupil of the projection objective lens 1.

Specifically, consider a case where alignment is effected at point a indicated in FIG. 6. Let it be assumed that the vector formed by regularly projecting the principal ray of the projection objective lens 1 onto the xy plane on the reticle R is $\vec{c}$. Also, as the unit vector representing in which direction the inclination of the principal ray faces as viewed from the optic axis of the projection objective lens 1, $\vec{g}$ is represented by $$\vec{g}(\theta) = (\cos\theta, \sin\theta), \quad |\vec{g}| = 1,$$

and if the amount of inclination of the principal ray at a point on the reticle which is spaced apart by the distance r from the optic axis of the projection objective lens 1, i.e., the amount of deviation from telecentricity, is function f(r) as a scalar, f(r) is represented by $$f(r) = |\vec{c}|$$

and $\vec{c}$ is represented by a function of r and $\theta$ as follows:

$$\vec{c}(r,\theta) = f(r)\vec{g}(\theta).$$

Figure 8:
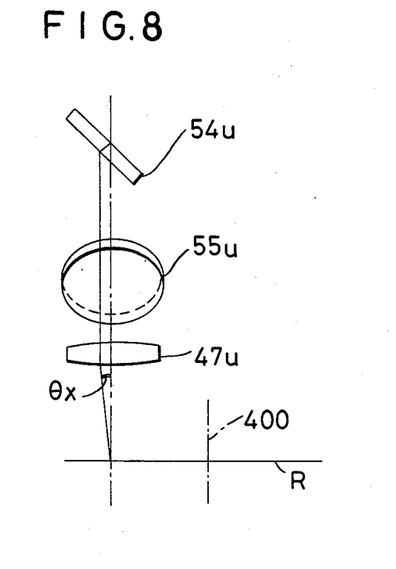
FIG. 8 is a cross-sectional view along the arrow VII of FIG. 6.
Figure 9:
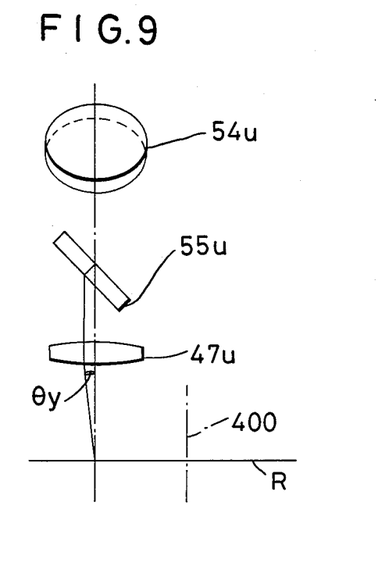
FIG. 9 is a cross-sectional view along the arrow VIII in FIG. 6.

Next, a unit vector parallel to the x-axis and having a positive sense of x is represented by a, and a unit vector parallel to the y-axis and having a positive sense of y is represented by b; By using these unit vectors, c can be primarily represented, but by taking the inner product of $\vec{a}$ and $\vec{c}$ of $\vec{b}$ and $\vec{c}$, $$(\vec{a}\cdot\vec{c}) = x$$

$$(\vec{b}\cdot\vec{c}) = y$$

and thus, c is represented by the scalar amount X, Y and from this value, how much the plane parallel plates 54u and 55u may be rotated can be found. This state is illustrated in FIGS. 8 and 9 which correspond to views taken along arrows VII and VIII, respectively, of FIG. 6. In these figures, to explain the actions of the two plane parallel plates 54u and 55u plainly, the mirror 48u is omitted and the optical path is shown to be developed.

Figure 10:
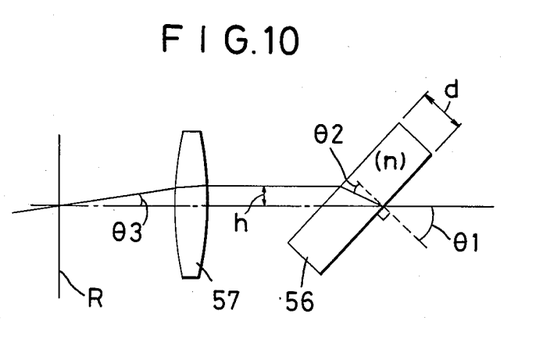
FIG. 10 illustrates the principle for changing the angle of inclination of the principal ray of an illuminating light beam.

The principle will first be described with reference to FIG. 10. When the thickness of the plane parallel plate 56 is d and the refractive index thereof is n and this plane parallel plate 56 is rotated by $\theta_1$, relative to the optic axis, the principal ray of the alignment light incident from the right-hand side in FIG. 10 shifts from the optic axis and, if this amount is h, h is expressed as $$h = d\frac{\sin(\theta_1 - \theta_2)}{\cos \theta_2} \quad (1)$$

(where $n \sin \theta_2 = \sin \theta_1$)

Also, the first objective lens 57 is an aplanat lens and, if its focal length is f, the inclination $\theta_3$ of the principal ray on the reticle R can be found from the following relation:

$$h = f \sin \theta_3 \quad 2$$

From the above equation, it is seen that the angle of inclination $\theta_3$ of the principal ray on the reticle R is varied by the angle of rotation $\theta_1$, the thickness d and the refractive index n of the plane parallel plate 56 and also depends on the focal length of the first objective lens 57.

Specifically describing this with reference to FIGS. 8 and 9, the principal ray of the alignment light incident from the upper portion of these figures is on the optic axis of the alignment microscope system U, but if the plane parallel plate 54u is rotated as shown in FIG. 8, the principal ray of the alignment light can be shifted in the x-direction. Likewise, if the plane parallel plate 55u is rotated as shown in FIG. 9, the principal ray of the alignment light will shift in the y-direction. Thus, the principal ray shifted from the optic axis is inclined by $\theta_x$ in the x-direction and $\theta_y$ in the y-direction on the reticle R relative to the optic axis by the aplanatic first objective lens 47u. This amount of inclination is varied as shown in equations (1) and (2) above by the angles of rotation, the thicknesses and the refractive indices of the two plane parallel plates 54u and 55u and the focal length of the first objective lens 47u. In this manner, the angle of inclination of the principal ray of the alignment light is shifted on the reticle R, whereby on the wafer side, the principal ray becomes parallel to the optic axis and enters the wafer perpendicularly thereto, and the reflected light from the wafer directly returns along the optical path along which it has entered the wafer, and arrives at a space filter 51u. The state of the optical path as viewed along arrow VII of FIG. 6 in the case where attention is paid to the point a in FIG. 6 is shown as a conceptional view in FIG. 11.

Figure 11:
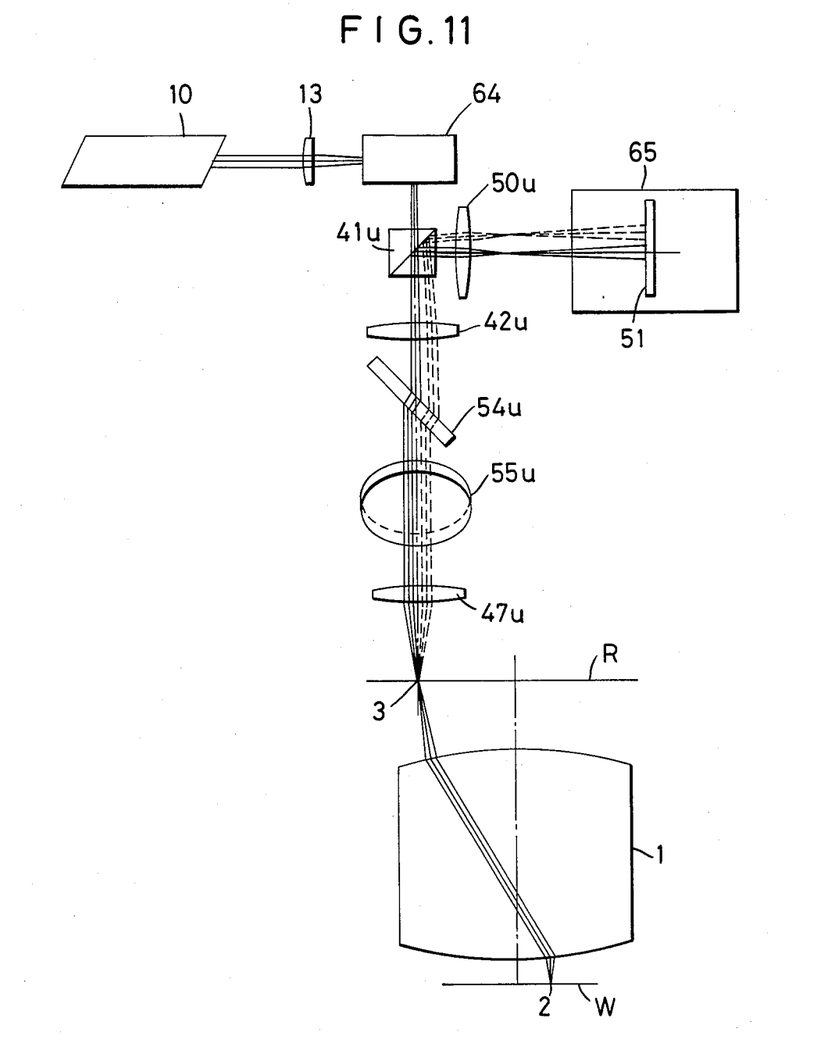
FIG. 11 is a conceptional view showing the state of the optical path as viewed along the arrow VII of FIG. 6.

As shown in FIG. 11, when the position of the alignment mark 3 has been moved, the light is always telecentric on the wafer W side by changing the angles of inclination of the two telecentricity correcting plane parallel plates 54u and 55u in accordance with the amount of telecentricity deviation f(r) at that position, and any positional deviation of the reflected light from the wafer W does not occur on the space filter 51. The illuminating light beam indicated by solid lines in FIG. 11 undergoes the shift by the plane parallel plate 55u and becomes telecentric on the wafer W side. The regularly reflected light from the wafer returns along the path along which it has come, and is reflected by the half-prism 41u, whereafter it enters an optical signal detecting system 65 having a space filter. On the other hand, the scattered and diffracted lights from the wafer and the reticle are reflected by the half-prism 41 and arrive at the marginal portion of the space filter. The light ray indicated by broken lines in FIG. 11 is the regularly reflected light from the reticle R, and on the space filter, it arrives at a position deviated from the optic axis.

Figure 12:
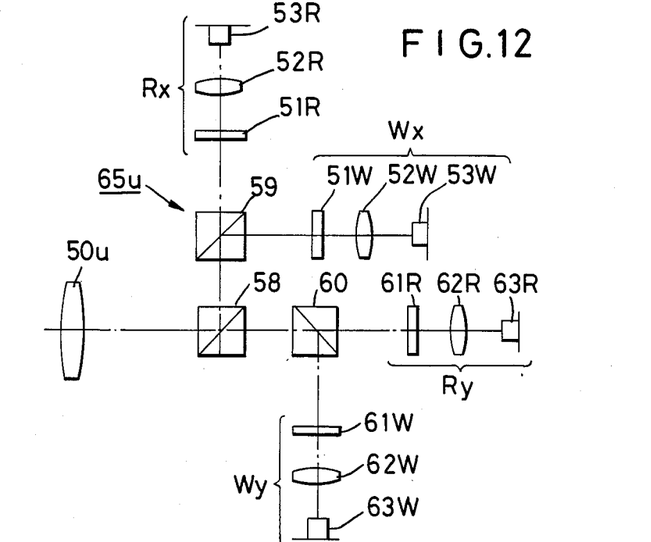
FIG. 12 is a view schematically showing a specific example of the construction of an optical signal detecting optical system.

FIG. 12 shows a specific example of the construction of the optical signal detecting optical system 65u shown in FIGS. 2 and 11. The optical signal detecting system 65l provided in the lower microscope system is also similar in construction and function to that which is shown in FIG. 12. In the optical signal detecting system 65u of FIG. 12, a reticle mark detecting system Rx for detecting the scattered light from the reticle R when the alignment light is caused to scan in the x-direction is comprised of a space filter 51R, a condensing lens 52R and a detector 53R, and a wafer mark detecting system Wx for detecting the diffracted light from the wafer W is comprised of a space filter 51W, a condensing lens 52W and a detector 53W. On the other hand, a reticle mark detecting system Ry for detecting the scattered light from the reticle R when the alignment light is caused to scan in the y-direction is comprised of a space filter 61R, a condensing lens 62R and a detector 63R, and a wafer mark detecting system Wy for detecting the diffracted light from the wafer is comprised of a space filter 61W, a condensing lens 62W and a detector 63W. These four detecting systems are formed by dividing the light beam from a relay lens 50u by half-prisms 58, 59 and 60.

Figure 13:
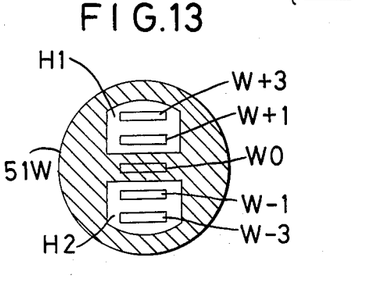
FIG. 13 is a plan view showing the positional relation between a space filter disposed in a wafer mark detecting system and the diffracted light from the wafer mark.

The space filter 51W provided in the wafer mark detecting system Wx, as shown in the plan view of FIG. 13, has a pair of openings H1 and H2 in the upper and lower parts of the marginal portion thereof, and the portion thereof indicated by hatching is a light-intercepting portion. In FIG. 13, the state of the reflected light from the wafer mark is also shown, and the +1st-order and +3rd-order diffracted lights produced from the wafer when a diffraction grating pattern forming a cross mark on the wafer W (the respective sides of the square minute pattern rows 2a and 2b forming the cross mark generally functions as a diffraction grating) is scanned by a band-like scanning beam Bx are represented as $W_{+1}$ and $W_{+3}$, respectively, the 0-order light (the regularly reflected light) from the wafer W is represented as $W_0$, and the −1st-order and −3rd-order diffracted lights are represented as $W_{-1}$ and $W_{-3}$, respectively.

Figure 14:
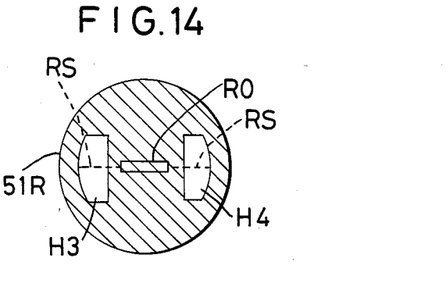
FIG. 14 is a plan view showing the positional relation between a space filter disposed in a reticle mark detecting system and the scattered light from the reticle mark.

Referring to FIG. 14 which is a plan view of the space filter 51R provided in the reticle mark detecting system Rx, only a pair of openings H3 and H4 at left and right are adapted to transmit light therethrough. Again in this figure, the state of the reflected light from the reticle mark is also shown. $R_0$ designates the 0-order light from the reticle R, and Rs denotes the scattered light by the edge on the reticle R.

When the band-like vertical scanning beam Bx as shown in FIG. 5 is positioned on the vertically arranged square minute pattern row 2a of the cross mark 2, the diffracted light from the vertically arranged square minute pattern row 2a enters the space filter 51 of the wafer mark detecting system Wx, as shown in FIG. 13, and the other diffracted lights than the 0-order light, i.e., the +1st-order, +3rd-order, −1st-order and −3rd order diffracted lights pass through the openings H1 and H2, respectively, to the detector 53W. When the band-like vertical scanning beam Bx as shown in FIG. 5 has arrived at the image 30 of the edge of the light-intercepting portion as the alignment mark on the reticle R, the scattered light Rs at the edge of the light-intercepting portion enters the space filter 51R of the reticle mark detecting system Rx, and passes through the openings H3 and H4 to the detector 53R.

Although not shown in FIG. 12, optical signal processing can actually be effected discretely from the +1st-order, +3rd-order, −1st-order and −3rd-order from the wafer W, that is, while being distinguished in conformity with the positive and negative of the diffracted lights.

Also, the space filter 61W in the wafer mark detecting system Wy and the space filter 61R in the reticle mark detecting system Ry are of the same construction as the space filters 51W and 51R, respectively, for the mark detection in the x-direction shown in FIGS. 13 and 14, and differ from the latter only in that from the viewpoint of the optical arrangement, they are arranged in a direction rotated by 90° retative to the position shown in FIGS. 13 and 14, and are functionally equivalent to the latter and therefore need not be described in detail.

Figure 15:
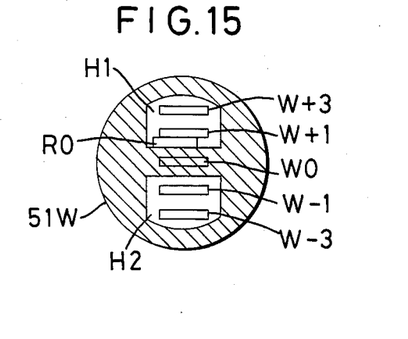
FIG. 15 is a plan view showing the positional relation of the regularly reflected light from the reticle mark on the space filter disposed in the wafer mark detecting system.
Figure 16:
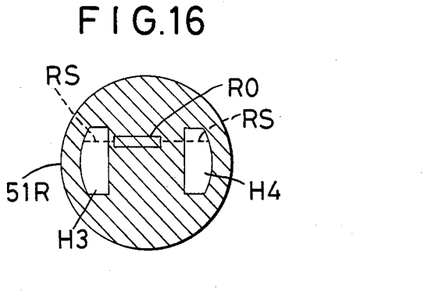
FIG. 16 is a plan view showing the positional relation between the regularly reflected light and scattered light from the reticle mark on the space filter disposed in the reticle mark detecting system.

Now, where the projection objective lens 1 has an aberration of the pupil thereof as shown in FIG. 11, it is possible to strictly maintain the telecentricity on the wafer W side by purposely destroying the telecentricity on the reticle R side, but in some cases, the optical signal from the reticle R may be deviated by the space filters 51W, 61W and 51R, 61R of the respective detecting systems and, as shown in FIGS. 15 or 16, the 0-order light $R_0$ from the reticle R may be positionally deviated and mixed with the diffracted light from the wafer W. However, this may be prevented by electrically applying offset as a predetermined amount of bias. To apply this offset, it is effective to detect the diffracted lights from the wafer while destinguishing the positive and negative thereof. Also, if the pitch of the diffraction pattern on the wafer W is changed, the angle of diffraction will change and the positions of the 0-order and ±1st-order diffracted lights from the wafer W will become separate from each other and therefore, the 0-order light from the reticle R can also be intercepted. In FIG. 16, the pattern for transmitting the scattered light therethrough is widened in the vertical direction with the aberration of the pupil of the projection objective lens taken into account and therefore, there is no problem. By effecting the optical signal processing in this manner, alignment of good accuracy has become possible.

While in the above-described embodiment, two plane parallel plates 54u and 55u are used in a microscope optical system to effect correction, a single plane parallel plate may be used to rotate in two axial directions. Also, a both-side telecentric projection objective lens has been described, but the present invention is also applicable in a one-side telecentric projection objective lens.

Further, in the above-described embodiment, the exposure apparatus has been described as an exposure apparatus having a reduction projection objective lens, whereas a similar effect may be obtained not only in the case of reduction projection but also in a one-to-one magnification or enlargement projection objective lens.

Figure 17:
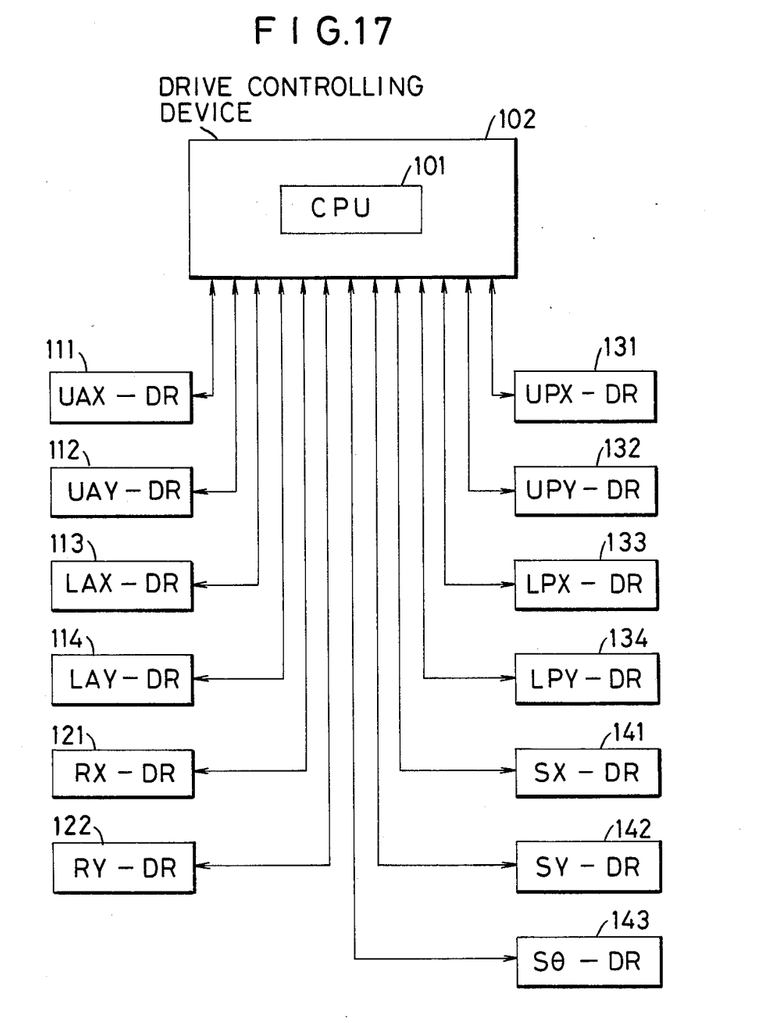
FIG. 17 is a block diagram showing portions of the apparatus of the present invention.

In FIG. 17, a drive controlling apparatus 102 controls various drive devices. Drive devices 111 and 112 move an alignment optical system U in x- and y-directions, and drive devices 113 and 114 move an alignment optical system L in x- and y-directions. Drive devices 121 and 122 move a reticle holder holding the reticle R in x- and y-directions. Drive device 131 and 132 rotate the plane parallel plates 54u and 55u of the alignment optical system U. Drive devices 133 and 134 rotate the plane parallel plates 54l and 55l of the alignment optical system L. Drive devices 141 and 142 move a stage supporting the wafer W thereon in x- and y-directions, and drive device 143 rotates the stage in a plane perpendicular to the optic axis 400 of the projection objective lens 1. Each of the above-described drive devices has a motor, an encoder for detecting the amount of revolution of the motor, and an interferometer for detecting the position of a member (for example, the stage) moved by revolution of the motor, and outputs signals indicative of the amount of revolution of the motor and the mount of movement of the member to the drive controlling apparatus 102. The drive controlling apparatus 102 causes a CPU 101 contained therein to control the revolution of the motor of each drive device on the basis of the output from each drive device.

Description will hereinafter be made of the operation of actually effecting alignment by the use of the alignment optical system according to the present invention as described above.

As the technique of effecting alignment, there may be adopted two types of technique, i.e., a case where telecentricity correction is effected simultaneously with the operation of the alignment optical system, and a case where the current position of the alignment optical system moved to an arbitrary position is detected and telecentricity correction corresponding thereto is effected.

Figure 18:
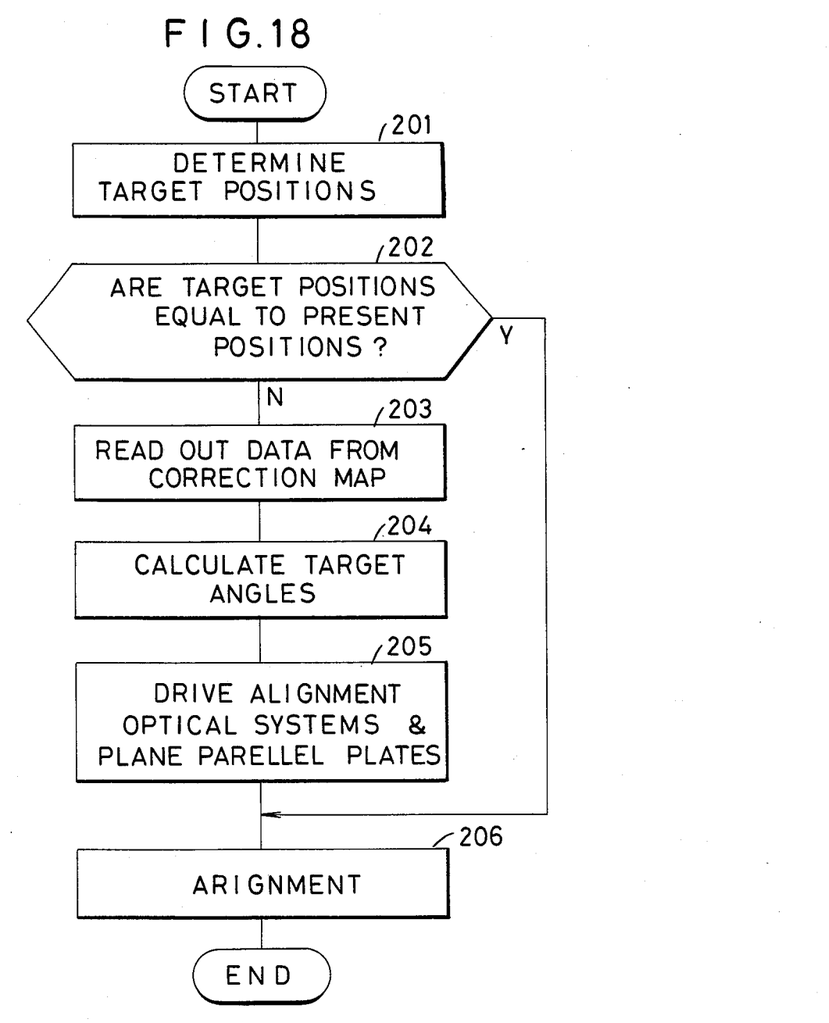
FIG. 18 is a flow chart showing the operation of the apparatus of the present invention.

FIG. 18 is a flow chart showing the method in a case where when the position of the alignment mark is known in advance, telecentric correction is automatically effected in the block diagram of FIG. 17 to execute alignment. CPU 101 stores in its internal memory the amount of correction of telecentricity corresponding to the position of the optic axis of the alignment optical system (the position relative to the optic axis of the projection optical system) as the data of each position of the alignment optical system at a predetermined interval. The data of this amount of correction at each position will hereinafter be referred to as correction map.

Let it be assumed that the positions of the alignment marks of the reticle R are known in advance. First, at step 201, the target positions of the alignment optical systems U and L are determined in accordance with the positions of the alignment marks. Whether these determined positions are the same as the positions at which the alignment optical systems are at present is judged at step 202. If the target positions differ from the current positions, CPU 101 picks up the data of the correction map corresponding to the target positions of the alignment optical systems at step 203, and calculates the target angles of the plane parallel plates for correction at step 204. When the calculation is completed, at step 205, the alignment optical systems U and L and the plane parallel plates 54u, 55u, 54l and 55l are driven at a time to the target positions and the calculated target angles, respectively, by the drive controlling apparatus 102. Thus, automatic correction of telecentricity is accomplished, where after or when the target positions of the alignment optical systems are equal to the current positions, auto-alignment is executed and terminated at step 206 on the assumption that the correction of telecentricity has already been done.

We claim:

1. A projection exposure apparatus on which are placed a reticle whose pattern is comprised of an area transmitting a radiation therethrough and an area not transmitting the radiation therethrough and a substrate, including:
- (a) a projection optical system for projecting the pattern formed on said reticle onto said substrate, said projection optical system being telecentric on said substrate side;
- (b) means producing a radiation beam for alignment of said reticle and said substrate;
- (c) alignment means for supplying said radiation beam onto said substrate through said reticle and said projection optical system and detecting the relative positional relation between said reticle and said substrate through said projection optical system;
- (d) means for imparting displacement with respect to said projection optical system to the position of incidence of said radiation beam onto said projection optical system by said alignment means;
- (e) means for outputting a position signal conforming to the relative position of the optic axis of said projection optical system and said position of incidence; and
- (f) deflecting means responsive to said position signal to deflect the angle of the principal ray of said radiation beam entering said projection optical system so that the telecentricity of said projection optical system on said substrate side is maintained.

2. A projection exposure apparatus according to claim 1, wherein said alignment means has an alignment optical system for directing said radiation beam to said reticle, and said deflecting means includes a plane parallel plate and means for changing the angle of inclination of said plane parallel plate in said alignment optical system in response to said position signal.

3. A projection exposure apparatus according to claim 2, wherein said control means includes calculating means for calculating the angle of inclination of said plane parallel plate in response to said position signal.

4. A projection exposure apparatus according to claim 3, wherein said calculating means has memory means having stored therein correction data conforming to the relative position of the optic axis of said projection optical system and said position of incidence, and calculates said angle of inclination from said correction data.

5. A projection exposure apparatus according to claim 4, wherein said correction data conforms to the optical characteristic of said projection optical system.

6. A projection exposure apparatus according to claim 5, wherein said alignment means has first radiation detecting means for detecting the reflected radiation from said substrate through a portion of said alignment optical system, and second radiation detecting means for detecting the reflected radiation from said reticle through a portion of said alignment optical system.

7. A projection exposure apparatus according to claim 6, wherein said alignment means includes means responsive to the outputs of said first and second radiation detecting means to render the relative position of said reticle and said substrate into a predetermined relation.

8. An apparatus on which a reticle and a substrate are placed, including:
- (a) a projection optical system for projecting a pattern formed on said reticle onto said substrate;
- (b) alignment means for supplying a radiation beam onto said substrate through said reticle and said projection optical system and detecting the positional relation between said reticle and said substrate through said projection optical system;
- (c) displacing means for imparting displacement between the position of incidence of said radiation beam onto said projection optical system by said alignment means and said projection optical system;
- (d) means for making a position signal conforming to the relative position of the optic axis of said projection optical system and said position of incidence; and
- (e) deflecting means responsive to said position signal to deflect the angle of the principal ray of said radiation beam from said alignment means to said reticle.

9. An apparatus according to claim 8, wherein said alignment means has an alignment optical system for directing said radiation beam to said reticle, and said deflecting means includes a plane parallel plate and control means responsive to said position signal to control the angle of inclination of said plane parallel plate in said alignment optical system.

10. An apparatus on which a reticle and a substrate are placed, including:
- (a) a projection optical system for projecting a pattern formed on said reticle onto said substrate;
- (b) alignment means for detecting the positional relation between said reticle and said substrate, said alignment means having an alignment optical system for supplying a radiation beam onto said substrate through said reticle and said projection optical system; and
- (c) deflecting means for deflecting the angle of the principal ray of said radiation beam from said alignment means to said reticle so that the telecentricity of said radiation beam on said substrate side of said projection optical system is maintained.

11. An apparatus according to claim 10, further having means for making a position signal conforming to the relative positional relation between the optic axis of said projection optical system and the optic axis of said alignment optical system and wherein said deflecting means is responsive to said position signal to determine said angle.

12. An apparatus according to claim 11, further having displacing means for imparting displacement between the optic axis of said alignment optical system and the optic axis of said projection optical system.

* * * * *